United States Patent [19]

Salera

[11] 4,167,647
[45] Sep. 11, 1979

[54] HYBRID MICROELECTRONIC CIRCUIT PACKAGE

[75] Inventor: Edmond A. Salera, Santa Barbara, Calif.

[73] Assignee: Santa Barbara Research Center, Goleta, Calif.

[21] Appl. No.: 683,128

[22] Filed: May 4, 1976

Related U.S. Application Data

[63] Continuation of Ser. No. 511,420, Oct. 2, 1974, abandoned.

[51] Int. Cl.² .............................................. H05K 5/06
[52] U.S. Cl. ................................. 174/52 FP; 361/389
[58] Field of Search ........................ 339/17 CF, 174; 174/52 FP; 361/389

[56] References Cited

U.S. PATENT DOCUMENTS

| | | | |
|---|---|---|---|
| 3,312,540 | 4/1967 | Plumbo | 174/52 FP |
| 3,381,372 | 5/1968 | Capano | 174/52 FP |
| 3,622,419 | 11/1971 | London | 174/52 FP |
| 3,873,173 | 3/1975 | Anhalt | 17/17 CF |

Primary Examiner—Neil Abrams
Attorney, Agent, or Firm—William J. Bethurum; W. H. MacAllister

[57] ABSTRACT

An electronic package including a single substrate for supporting a semiconductor device or die, an integrated circuit chip, or other electronic components on each side thereof. The substrate is configured with a plurality of cavities which are spaced around its outer periphery for receiving a corresponding plurality of electrical pin connections. These pin connections are readily accessible for connection to devices, circuits or other electrical components mounted on both sides of the substrate, thereby maximizing the packing density of the package.

5 Claims, 6 Drawing Figures

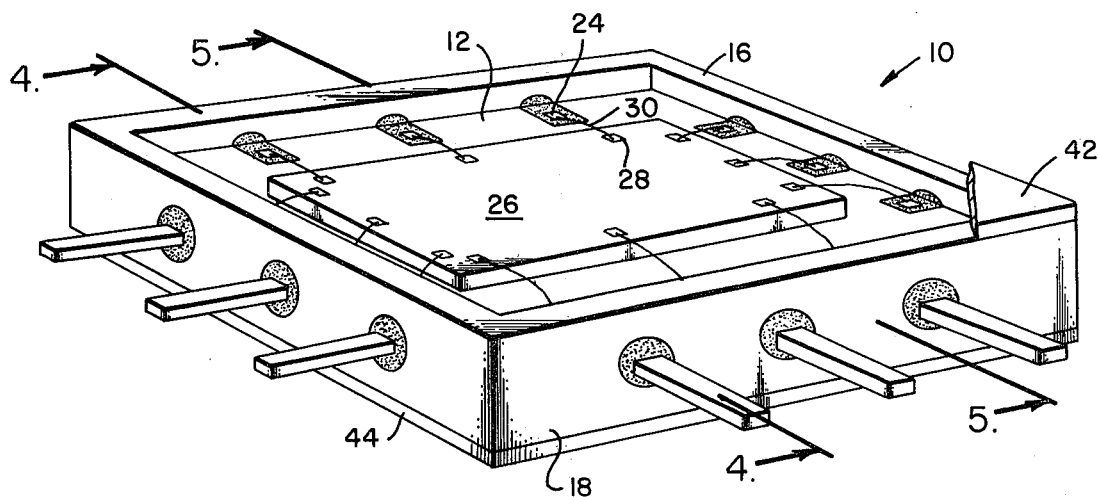
Fig. 3.
Fig. 4.
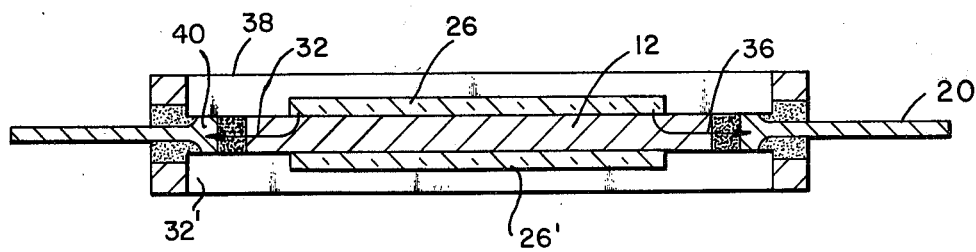
Fig. 5.
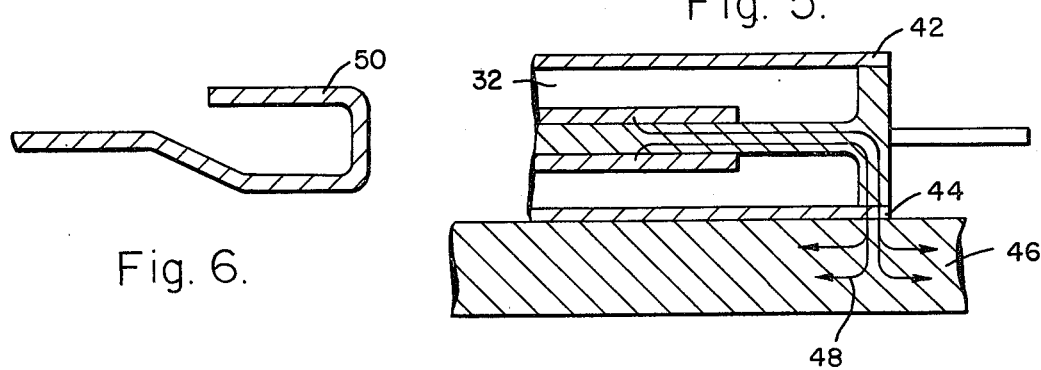
Fig. 6.

HYBRID MICROELECTRONIC CIRCUIT PACKAGE

RELATED APPLICATION

This is a continuation of application Ser. No. 511,420, filed Oct. 2, 1974, now abandoned.

FIELD OF THE INVENTION

This invention relates generally to microelectronic packages and more particularly to a "flatpack" type of microelectronic circuit package featuring common pin connections to both sides of a single substrate.

BACKGROUND OF THE INVENTION

The so called "flatpack" has been available in the semiconductor industry for several years for housing a variety of semiconductor devices and integrated circuits. This package is well known in the semiconductor packaging art and is found in a number of different package configurations. Typically, these packages include: (1) a substrate for supporting an integrated circuit, semiconductor device or other electronic component, (2) a housing surrounding (and sometimes supporting) the substrate and providing some physical protection for the substrate and components mounted thereon, and (3) a plurality of electrical leads or pin connections which extend through a corresponding plurality of openings in the housing and into close proximity with the outer periphery of the substrate. Conventional die bonding techniques are used to bond an integrated circuit chip or semiconductor die to the substrate, and conventional wire bonding techniques are utilized to bond tiny wires to various active regions of the die or chip and also to the above plurality of electrical leads. These leads typically terminate above and near the edge of the semiconductor chip or die.

It has been a standard practice in the semiconductor industry for many years to utilize a so called lead frame in the above package fabrication process. This lead frame consists of a metal strip containing the above lead connections and is normally left intact until the above package is completed, whereafter the individual leads extending into the flatpack housing and into electrical contact with the semiconductor die or chip are stamped out of the unitary lead frame member. This technique facilitates the assembly-line handling, packaging and electrical testing of the individual flatpacks, which are individually stamped out of the unitary lead frame member.

PRIOR ART

In the above type of semiconductor flat package, the standard lead-in connection to the semiconductor die normally includes one complete set of leads, frequently ten or twelve, for connection to a corresponding ten or twelve wires leading from a semiconductor die mounted on one surface of a substrate. Furthermore, it is a common prior art practice to use only one surface of the substrate of the flat package for supporting one or more semiconductor dice. Thus, the lead connections for the package normally extend into close proximity to, and above, the edges of a semiconductor die. Thus, an assembly line worker can readily make the necessary wire bonds, first to the die and then up to a corresponding lead connection. Well known thermocompression wire bonding or ultrasonic wire bonding techniques have been used for many years for accomplishing this purpose, and these techniques frequently employ a capillary tube wire bonding member for guiding and controlling the lead wires during the wire bonding process.

While the above prior art packaging techniques have served the semiconductor industry well for many years and have provided very useful and economical techniques for the mass production of semiconductor flat packages, this particular prior art nevertheless fails to fully utilize the available vertical space in the above defined flat packages. Therefore, this prior art fails to maximize the vertical packing density in said packages.

THE INVENTION

The general purpose of this invention is to provide a novel alternative packaging approach in place of the above prior art flat package construction techniques and an approach which features greatly improved packing density and heat sinking characteristics relative to the above prior art packaging techniques. To accomplish this purpose, I have provided a microelectronic package which includes a substrate having a plurality of cavities spaced around the outer periphery thereof. This substrate is adapted to receive a semiconductor die or other electrical component on each side thereof, and a plurality of lead-in connections are securely mounted within the corresponding plurality of cavities in the substrate and are accessible for electrical connection to both sides of the substrate. Therefore, semiconductor dice or other electrical components mounted on each side of the substrate may share common electrical connections leading from the package to the outside world. Additionally, a semiconductor die or component mounted on one side of the substrate may be electrically connected via one of these leads to a semiconductor die or component mounted on the opposite side of the substrate.

Advantageously, the substrate may be integrally included in a unitary, closed I-beam type structure having aligned compartments adapted to receive glass, plastic, or epoxy or other suitable encapsulation means which provide the necessary physical and electrical protection for semiconductor devices, integrated circuit chips, or for other electrical components which are mounted on both sides of the common substrate. Furthermore, this closed I-beam type structure is ideally adapted to receive a plurality of electrical leads in a common plane and in an electrically insulating manner in each of the above cavities so as to maximize the overall packing density of the package.

Accordingly, it is an object of the present invention to provide a new and improved microelectronic flat package for semiconductor devices, integrated circuits and other like electronic components.

Another object is to provide a novel flat package of the type described wherein the vertical packing density is substantially increased relative to prior art flat packs, without increasing the lateral packaging area.

Another object is to provide a flat package of the type described having improved heat sinking characteristics.

A novel feature of the present invention is the provision of a flat package including two identical aligned packaging compartments which physically and electrically isolate active and passive components and combinations thereof.

Another novel feature is the provision of a common substrate within the package, separating these compartments, and having a plurality of cavities spaced around the periphery thereof. The corresponding plurality of electrical leads which are mounted in these cavities serve to conduct heat away from the active and passive components mounted in the separate compartments of the package.

Another novel feature is the provision of a unitary I-beam structure for the package which includes a common substrate adapted to receive a chosen encapsulating medium on each of two opposing sides thereof.

Another novel feature is the provision of a plurality of lead pins or connections mounted in the common plane of the substrate and capable of very close spacing as a result of being imbedded within insulating material in the cavities of the substrate.

Another novel feature is the provision of a plurality of leads or pins which may be formed in a hook-like configuration, so as to easily provide a common electrical connection to both sides of the substrate with a minimum of metal required.

Another feature is the provision of a microelectronic flat package of the type described which can be configured as an all ceramic package, an all metal package, or a combination of metal and ceramic materials.

These and other objects and features of the invention will become more readily apparent in the following description of the accompanying drawings.

DRAWING

FIG. 3 illustrates, in perspective view, the die bonding and wire bonding of a semiconductor die on one substrate surface of the structure in FIG. 2.

FIG. 4 is an elevational cross-section view taken along lines 4—4 of FIG. 3 and shows the encapsulated die and wire bonded components on each side of the common substrate member of my novel flatpack.

FIG. 5 is an enlarged view of one end of the flatpack and taken along lines 5—5 of FIG. 3.

FIG. 6 is a cross section view of a hook shaped electrical lead-in connection for the flatpack and an alternative construction for the lead 34.

Figure 1:
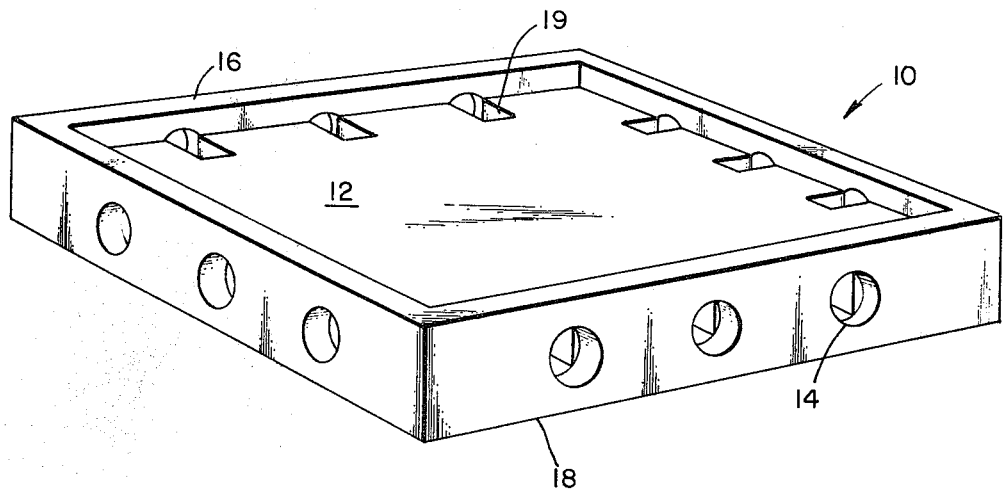
FIG. 1 illustrates, in perspective view, the starting I-beam substrate member utilized in fabricating the present invention.

Referring now to FIG. 1, there is shown in perspective view an I-beam housing structure, generally designated 10, and having a common supporting substrate 12 for receiving semiconductor dice or other electronic components on opposing sides thereof. The I-beam structure 10 is a unitary structure which may consist of a metal such as beryllium-copper, an epoxy plastic, a ceramic such as aluminum-oxide, (Al$_2$O$_3$), or even a dielectric material such as Teflon. The I-beam structure 10 includes upstanding continuous wall portions 16 and 18 surrounding the outer edges of both upper and lower surfaces of the substrate 12 so as to form partially enclosed compartments on each side of the substrate 12 for receiving semiconductor dice or other electronic components.

The I-beam structure 10 further includes a plurality of cavities 14 which are seen as cylindrical openings within the continuous closed walls 16 and 18 of the structure 10, and such cavities extend a predetermined distance into the common substrate 12 as shown. These cavities are further defined by the carved-out receptacles 19 of the substrate 12 which extend inwardly from the cylindrical openings 14 and towards the center of the substrate 12.

Figure 2:
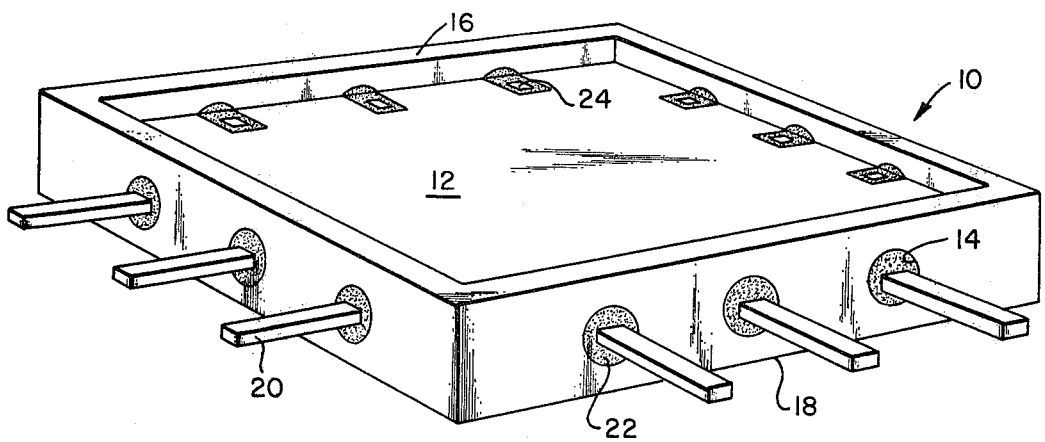
FIG. 2 illustrates, in perspective view, the mounting of the lead or pin connections in the peripherial cavities of the I-beam structure of FIG. 1.

Referring now to FIG. 2, a plurality of electrical leads 20 are inserted, respectively, into the plurality of cavities 14 of the previously described I-beam structure, and an insulative cement bonding material 22 is compressed into the cavities 14 using well known injection molding techniques.

The contact portions 24 of the leads 20 are readily accessible to both sides of the substrate 12 and are otherwise insulated by the surrounding insulating bonding material 22 which serves to securely bond the leads 20 to the I-beam structure of FIg. 1. Advantageously, the leads 20 are within the generally planar volume defined by the substrate 12 and as such are accessible for bonding to devices or components mounted on both sides of the substrate 12. Furthermore, the bonding cement 23 is a good thermal conductor and provides excellent heat sinking between the active devices mounted on the substrate 12 and the electrical leads 20.

Referring now to FIG. 3, conventional die bonding techniques are utilized to bond a die, such as an integrated circuit chip 26, to each surface of the substrate 12. Furthermore, conventional wire bonding techniques are utilized to bond a plurality of tiny lead wires 30 from a plurality of bonding pads 28 on the integrated circuit chip 26 to the previously defined bonding areas 24 on the lead wires 20. These die bonding and wire bonding techniques are individually well known in the semiconductor packaging art and therefore will not be described in further detail herein.

Referring now to FIG. 4, the partially completed package shown in FIG. 3 is encapsulated with a suitable encapsulating material 32, 32' such as a clear epoxy resin suitable to withstand the typical heat ranges to which the semiconductor package will be subjected. Identical or dissimilar devices or components, 26, 26' may be bonded as shown to opposing surfaces of the common substrate 12 so that a single pin connection 20 may serve to electrically connect to devices, circuits or other components mounted on both sides of the substrate 12. A pair of thin metal covers 42 and 44 may advantageously be bonded in place as shown to cover the encapsulating material 32 and these covers extend across the entire width of the package. These covers 42 and 44 may be bonded in place using a suitable metal-to-metal or metal-to-dielectric cement, as the case may be, and the lower cover 44 is further bonded face to face with a suitable heat sink material, such as copper. The copper heat sink 46 provides a good thermally conductive path for heat via the main heat transfer path 48 (FIG. 5) and away from the interior of the package.

Thus, not only does the structure shown in FIG. 4 enhance the vertical packing density of my package relative to prior art flat packages, but the dotted line paths indicated as 36, 38 and 48 in FIGS. 4 and 5 provide excellent heat sinking and thermal conduction for the heat generated, for example, in active PN junction areas within the devices 26, 26' and via pin connections 20. Such direct "substrate-to-pin connection" heat sinking is not possible where the lead-in pin connections are mounted independentently of the substrate which supports the active devices within a package.

Various modifications may be made to the particular geometrical package configurations disclosed without departing from the true scope of my invention. For example, the lead connections 20 may have U-shaped end portions 50 as shown in FIG. 6 rather than the solid ends 40 shown in FIG. 4. Furthermore, it is not required that identical components or devices on opposite sides of the substrate 12 share identical leads 20, and furthermore it is not required that all of the pin connections 20 be utilized for any particular package application.

What is claimed is:

1. A flat package for housing and supporting electronic devices or circuits or other electrical components in substantially parallel planes comprising:
   (a) a substrate member having first and second substantially parallel and spaced-apart major surfaces lying in said parallel planes and with edges of a predefined contour and including a plurality of cavities spaced around said edges, said surfaces each adapted to receive a semiconductor die or other electrical component, and
   (b) a plurality of lead connections securely mounted within said plurality of cavities, respectively, and having exposed connection surfaces also lying substantially in said parallel planes and accessible to both major surfaces of said substrate, whereby semiconductor dice or other electrical components mounted on each side of said substrate and in said parallel planes may share one or more of the plurality of electrical leads, thereby enhancing the vertical packing density of said package, and said lead connections also serve to conduct heat away from said substrate.

2. The package defined in claim 1 further including an I-beam type structure incorporating said substrate member as an integral portion thereof and comprising upstanding wall means extending normal to each major surface of said substrate member so as to form a unitary package housing for receiving encapsulating material on each major surface of said substrate and within said I-beam type structure.

3. The package defined in claim 1 wherein said plurality of lead connections have a U-shaped end portion mounted within an electrically insulating material within each of said cavities, whereby opposing surfaces of said U-shaped portion are accessible to said major surfaces of said substrate for electrical connection to semiconductor dice or other components mounted on each side thereof.

4. A flat package for housing electronic components comprising:
   (a) a substrate member having spaced apart major surfaces lying in substantially parallel planes and including a plurality of cavities spaced around its periphery,
   (b) at least one semiconductor device, integrated circuit, or other electrical component mounted on each opposing surface of said substrate and having active bonding areas thereon to which electrical connections may be made,
   (c) a plurality of lead connections securely mounted within said plurality of cavities, respectively, and having surfaces thereof substantially coplanar with said substantially parallel planes of said substrate, respectively, and accessible to both sides of said substrate, and
   (d) a plurality of lead wires interconnecting opposing surfaces of said lead connections to devices, integrated circuits or other components mounted on both sides of said substrate, whereby the vertical packing density of said package is maximized and said lead connections serve to conduct heat away from said substrate.

5. The package defined in claim 4 wherein said substrate member includes a substantially flat supporting body for receiving said semiconductor dice or electrical components on the opposing faces thereof and further including upstanding enclosing wall means extending normal to each face of said body in an I-beam type structure so as to form a unitary package consisting of two aligned and particularly enclosed compartments for receiving encapsulating material or covers therein.

* * * * *